(12) United States Patent
Hayashi et al.

(10) Patent No.: US 7,491,427 B2
(45) Date of Patent: Feb. 17, 2009

(54) POLYIMIDESILOXANE SOLUTION COMPOSITION

(75) Inventors: Koji Hayashi, Yamaguchi (JP); Yoshiki Tanaka, Yamaguchi (JP); Katsutoshi Hirashima, Yamaguchi (JP); Seiichirou Takabayashi, Yamaguchi (JP)

(73) Assignee: UBE Industries, Ltd., Ube-Shi, Yamaguchi (JP)

( * ) Notice: Subject to any disclaimer, the term of this patent is extended or adjusted under 35 U.S.C. 154(b) by 378 days.

(21) Appl. No.: 10/589,982

(22) PCT Filed: Feb. 21, 2005

(86) PCT No.: PCT/JP2005/002749

§ 371 (c)(1),
(2), (4) Date: Aug. 18, 2006

(87) PCT Pub. No.: WO2005/080505

PCT Pub. Date: Sep. 1, 2005

(65) Prior Publication Data

US 2007/0185286 A1    Aug. 9, 2007

(30) Foreign Application Priority Data

Feb. 20, 2004    (JP)    ............... 2004-044530

(51) Int. Cl.
*B05D 3/02*    (2006.01)
(52) U.S. Cl. ............ 427/387; 524/268; 524/492; 524/588; 516/137; 516/139; 516/144; 516/191; 528/25
(58) Field of Classification Search ............ None
See application file for complete search history.

(56) References Cited

FOREIGN PATENT DOCUMENTS

| JP | 05-311144 | * | 11/1993 |
|---|---|---|---|
| JP | 10-219225 A | * | 8/1998 |
| JP | 10-231424 | | 9/1998 |
| JP | 2001-302913 | | 10/2001 |
| JP | 2002-012664 | | 1/2002 |
| JP | 2003/192910 | | 7/2003 |
| JP | 2004-124015 | | 4/2004 |

OTHER PUBLICATIONS

International Search Report, PCT/JP2005/002749, May 10, 2005.
International Preliminary Report on Patentability and Written Opinion of the International Searching Authority, PCT/JP2005/002749, Sep. 28, 2006.

* cited by examiner

*Primary Examiner*—Marc S Zimmer
(74) *Attorney, Agent, or Firm*—Nixon Peabody LLP; Jeffrey L. Costellia; Marc W. Butler

(57) ABSTRACT

[PROBLEMS] To provide a polyimidesiloxane solution composition that is excellent in defoaming ability and that can maintain the wettability of an outer lead bonded portion on a wiring board at a high level, even when it is applied on the surface of the wiring board and then cured, to form an insulating cured film.

[MEANS FOR SOLVING PROBLEMS] A polyimidesiloxane solution composition which comprises an organic solvent, polyimidesiloxane soluble in the organic solvent, a curable components such as an epoxy compound and a polyvalent isocyanate compound, and a silicone defoamer, wherein the silicone defoaming agent comprises dimethylpolysiloxane, a polysiloxane compound having a hydrophilic group in a side chain or a terminal moiety, and a micro-powder silica.

11 Claims, 1 Drawing Sheet

FIGURE
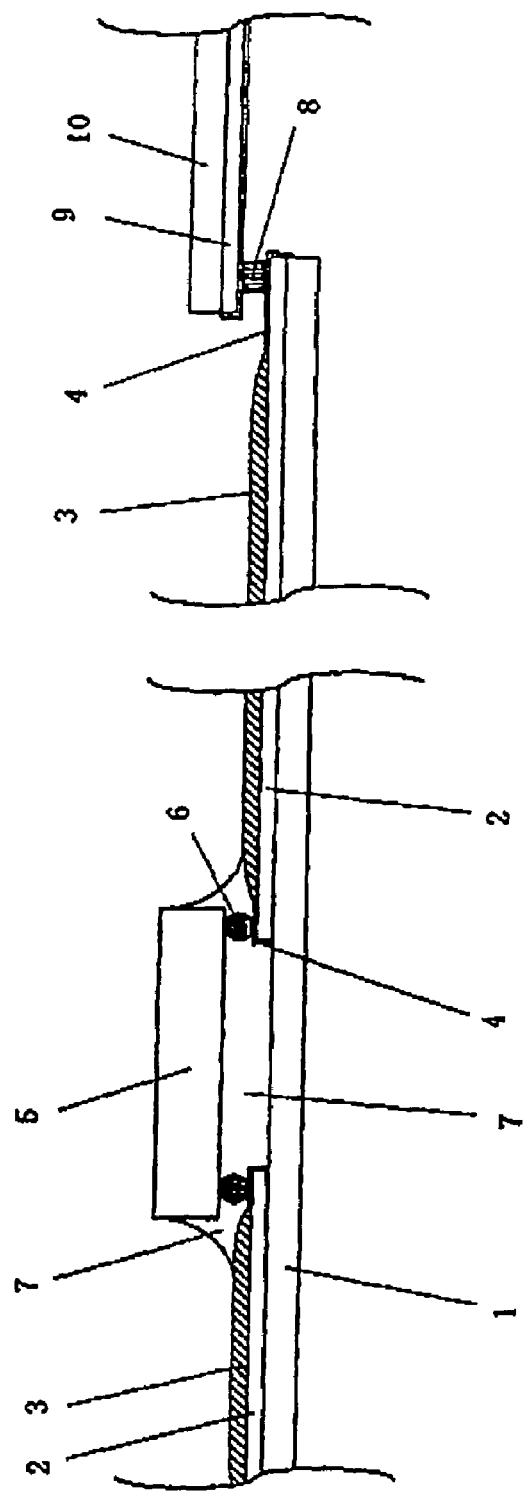

POLYIMIDESILOXANE SOLUTION COMPOSITION

FIELD OF THE INVENTION

The present invention relates to a polyimidesiloxane solution composition and more particularly relates to a polyimidesiloxane solution composition favorably employable for manufacturing a wiring board on which an insulating cured film is formed.

BACKGROUND OF THE INVENTION

In advance of performing a process for connecting an electronic component to a wiring board having an electric circuit wiring area thereon, a curable resin solution composition is applied on a certain area of the electric circuit wiring area to give a coated film, and then the coated film is heated to give an insulating cured film.

Document 1 (JP-A-2002-12664) describes a polyimidesiloxane solution composition employable for formation of an insulating film (protective film, solder resist, interlayer insulating layer, etc.) which is used in an electronic component packaging. The polyimidesiloxane solution composition contains polyimidesiloxane soluble in an organic solvent and a curable component such as an epoxy compound and/or a polyvalent isocyanate compound. The solution composition can be well coated on a substrate such as a flexible wiring board by a screening printing method, and the coated layer can be heated at a relatively low temperature to give an insulating cured film. Thus formed insulating cured film is closely attached to the substrate and does not bring about warpage of the substrate. Moreover, the insulating cured film is good in all of heat resistance, resistance to solvents, resistance to chemical materials, flexing resistance, and electric performance. Accordingly, the solution composition is favorably employable for forming an insulating cured film (protective film) for the purpose of protecting a flexible wiring board such as TAB (Tape Automated Bonding) tape or a flexible wiring board. The above-mentioned polyimidesiloxane soluble in an organic solvent is prepared by the reaction of an aromatic tetracarboxylic acid compound, a diaminopolysiloxane component, and an aromatic diamine compound having a polar group.

Document 1 further describes that a defoamer can be optionally added to the polyimidesiloxane solution composition. There are described examples of the defoamers such as an acrylic defoamer, an acrylvinyl ether defoamer, a fluorine-containing defoamer, and a silicone defoamer. As examples of the silicone defoamers, there are mentioned dimethylpolysiloxane defoamers of a solution type and an oil-compound type (e.g., KS-603 available from Shin-Etsu Chemical Industry Co., Ltd., and DB-100 available from Dow-Corning Corp.). The defoamer used in the working examples is Floren AC326F (i.e., acrylvinyl ether defoamer).

Heretofore, the electro-conductive connection of an electronic component to a wiring board has been made by the use of solder or a bump of an electro-conductive material such as gold. Recently, however, an anisotropic conductive material such as an anisotropic conductive film (ACF) or an anisotropic conductive paste (ACP) has been used for attaching an electronic component such as a liquid display component to a wiring board. The electronic connection is formed via an outer lead of the wiring board.

SUMMARY OF THE INVENTION

The inventors of the present invention have made studies on defoamers for the use in the polyimidesiloxane solution composition of the above-mentioned Document 1 to discover a defoamer which is more effective to impart adhesion of the insulating cured film produced by the polyimidesiloxane solution composition to an insulating board and further more effective for releasing air (bubble) from the solution composition in a short period of time. As a result, they have found that a dimethylpolysiloxane defoamer (silicone oil) which is a representative silicone defoamer is most effective for the above-mentioned purpose.

The inventors have further found, however, that a polyimidesiloxane solution composition of Document 1 containing a dimethylpolysiloxane defoamer to enhance defoaming property causes certain troubles when it is coated on a wiring board. In more detail, in the case that the above-mentioned polyimidesiloxane solution composition is coated on a wiring board to form an insulating cured film, an outer lead of the wiring board shows poor affinity to an anisotropic conductive material. Therefore, an electronic component cannot be connected to the outer lead via an anisotropic conductive material with good electro-conductive connection.

The inventors have further studied the reason of poor affinity between the anisotropic material and the outer lead. As a result, they have found that a film of the polyimidesiloxane solution composition containing a dimethylpolysiloxane defoamer which is coated on a wiring board releases a portion of the dimethylpolysiloxane defoamer onto a surface of the outer lead of the wiring board and that the released dimethylpolysiloxane remains on the outer lead after the coated film is heated to give an insulating cured film. Then, the inventors have concluded that the dimethylpolysiloxane remaining on the outer lead decreases affinity (that is, so-called wettability) of an anisotropic conductive material to the outer lead and that thus decreased affinity disturbs electric connection of the anisotropic conductive material to the outer lead.

Following the above-mentioned conclusion, the inventors have continued their studies and found that if a portion of the dimethylpolysiloxane (i.e., representative silicone defoamer) in the conventionally employed silicone defoamer comprising dimethylpolysiloxane and a micro-powdery silica is replaced with a dimethylpolysiloxane having a hydrophilic group (particularly, polyoxyalkylene group) in its side chain or at its terminal, the following favorable characteristics are imparted to the silicone defoamer: the defoaming property (i.e., property to smoothly release bubbles to outside) is improved, the release of the dimethylpolysiloxane from the coated and cured solution composition onto the outer lead of a wiring board is reduced; the affinity between the outer lead and the anisotropic conductive material is improved; and the anisotropic conductive material is connected to the outer lead with improved electric connection.

Accordingly, the present invention resides in a polyimidesiloxane solution composition comprising an organic solvent, a polyimidesiloxane soluble in the organic solvent, at least one curing component selected from the group consisting of an epoxy compound and a polyvalent isocyanate compound, and a silicone defoamer (i.e., antifoaming agent), wherein the silicone defoamer comprises dimethylpolysiloxane, a polysiloxane compound having a hydrophilic group in a side chain thereof or at a terminal thereof, and a micro-powdery silica.

The invention further resides in a method of preparing a wiring board having an insulating cured film on a surface thereof, which comprises a step of coating the polyimidesiloxane solution composition of the invention on a local area of an electric circuit surface of a wiring board to form a coated film, and a step of heating the coated film to give an insulating cured film.

The invention furthermore resides in a method of connecting an electronic component to a wiring board, which comprises the steps of coating the above-mentioned polyimidesiloxane solution composition of the invention on a local area of an electric circuit surface of a wiring board to form a coated film, heating the coated film to give an insulating cured film, and connecting an electronic component via an anisotropic conductive material to a wiring surface of the wiring board in an area having no insulating cured film thereon.

INDUSTRIAL UTILITY

The polyimidesiloxane solution composition of the invention smoothly releases air bubbles which have been incorporated into the solution composition when it is coated on a wiring board by a coating procedure such as screening printing. Further, the release of dimethylpolysiloxane from the coated solution composition onto an outer lead is reduced. Accordingly, the polyimidesiloxane solution composition of the invention can be favorably employed with good workability for preparing a wiring board having an insulating cured film.

Further, an electronic component can be connected via an electric conductive contact material, particularly, an anisotropic conductive material, onto the outer lead of the wiring board having an insulating cured film which is prepared using the polyimidesiloxane solution composition of the invention, with practically good electric property.

BRIEF DESCRIPTION OF DRAWINGS

FIG. 1 is a schematic section of a wiring board having an inner lead onto which a chip component is connected and an outer lead onto which an electrode of a liquid display device is connected via ACF or ACP.

1: an insulating board made of polyimide film
2: electric circuit wiring
3: cured film (protective film)
4: plated tin
5: IC chip component
6: gold bump
7: underfill
8: anisotropic conductive film or paste
9: electrode of liquid panel substrate
10: liquid panel substrate

PREFERRED EMBODIMENTS OF THE INVENTION

Preferred embodiments of the polyimidesiloxane solution compositions of the invention are described below.

(1) The polyimidesiloxane solution composition comprises 1 to 50 weight parts of the curing component and 1 to 10 weight parts of the silicone defoamer per 100 weight parts of the polyimidesiloxane soluble in the organic solvent.

(2) The defoamer contains the polysiloxane compound having a hydrophilic group in a side chain thereof or at a terminal thereof in an amount larger than an amount of the dimethylpolysiloxane.

(3) The defoamer composition comprises 1 to 20 weight parts of the micro-powdery silica per total 100 weight parts of the dimethylpolysiloxane and the polysiloxane compound having a hydrophilic group in a side chain thereof or at a terminal thereof.

(4) The hydrophilic group in the side chain or at the terminal of the polysiloxane compound is a polyoxyalkylene group (particularly, a group comprising a copolymer of ethylene oxide and propylene oxide).

(5) The polyimidesiloxane solution composition further comprises an inorganic filler.

(6) The polyimidesiloxane solution composition further comprises a curing catalyst (curing agent).

(7) The silicone defoamer shows a water drop contact angle of not higher than 50°.

The polyimidesiloxane soluble in an organic solvent and at least one curing component selected from the group consisting of an epoxy compound and a polyvalent isocyanate compound which are employable in the polyimidesiloxane solution composition of the invention are described below. As is described hereinbefore, the polyimidesiloxane solution composition of the invention is an improvement of the polyimidesiloxane solution composition described in the aforementioned Document 1. It is noted that Document 1 has detailed descriptions concerning the polyimidesiloxane soluble in an organic solvent, epoxy compound and polyvalent isocyanate compound.

The polyimidesiloxane soluble in an organic solvent which is employed in the polyimidesiloxane solution composition of the invention can be prepared from an aromatic tetracarboxylic acid compound and a diamine composition comprising diaminopolysiloxane and an aromatic diamine compound having a polar group, in essentially equal molar amounts, preferably in a 1.0 to 1.2 molar amount of the aromatic tetracarboxylic acid compound per one molar amount of the diamine composition. The reaction is performed in an organic solvent.

Examples of the aromatic tetracarboxylic acid compounds include aromatic tetracarboxylic acids such as 2,3,3',4'-biphenyltetracarboxylic acid, 3,3',4,4'-biphenyltetracarboxylic acid, 2,2',3,3'-biphenyltetracarboxylic acid, 3,3',4,4'-diphenylethertetracarboxylic acid, 3,3',4,4'-diphenylsulfonetetracarboxylic acid, 3,3',4,4'-benzophenonetetracarboxylic acid, 2,2-bis(3,4-benzenedicarboxylic acid)hexafluoropropane, pyromellitic acid, 1,4-bis(3,4-benzenedicarboxylic acid)benzene, 2,2-bis[4-(3,4-phenoxycarboxylic acid)phenyl]propane, 2,3,6,7-naphthalenetetracarboxylic acid, 1,2,5,6-naphthalenetetracarboxylic acid, 1,2,4,5-naphthalenetetracarboxylic acid, 1,4,5,8-naphthalenetetracarboxylic acid, and 1,1-bis(2,3-dicarboxyphenyl)ethane; acid dianhydrides thereof; and esters thereof with a lower alcohol. Preferred are 2,3,3',4'-biphenyltetracarboxylic acid, 3,3',4,4'-diphenylethertetracarboxylic acid and 2,2',3,3'-biphenyltetracarboxylic acid, dianhydrides thereof, and esters thereof with a lower alcohol, because these compounds give polyimidesiloxanes having a good solubility in an organic solvent.

As the aromatic tetracarboxylic acid compound, an aromatic tetracarboxylic acid dianhydride is preferred, because the dianhydride easily reacts with the diamine composition. If the aromatic tetracarboxylic acid dianhydride is employed in an amount more than 1.05 molar amount per one molar amount of the diamine composition, an unreacted anhydride ring remains in the reaction product. The unreacted ring can be kept present without a further processing, but can be reacted with an esterifying agent to open the anhydride ring and yield a half-ester product.

The diamine composition of the invention can contain diamine compounds other than the diaminopolysiloxane and the aromatic diamine compound having a polar group. The diamine composition of the invention preferably comprises 30-95 molar %, preferably 50-95 molar %, more preferably 60-95 molar %, of the diaminopolysiloxane, 0.5-40 molar % of the aromatic diamine compound having a polar group, and 0-69.5 molar % (generally 0-30 molar %) of other diamine compounds.

The diaminopolysiloxane constituting a diamine component of the polyimidesiloxane preferably has the following formula (1):

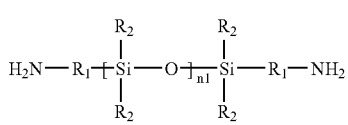

Formula (1)

In the formula (1), $R_1$ represents a divalent hydrocarbon group or aromatic group; $R_2$ independently represents a monovalent hydrocarbon group or aromatic group; and n1 represents an integer of 3 to 50. Preferably, $R_1$ independently represents a divalent hydrocarbon group having 1 to 6 carbon atoms or phenylene, especially propylene; $R_2$ independently represents an alkyl group having 1 to 5 carbon atoms or phenyl; and n1 preferably is 3 to 20. If the diaminopolysiloxane is a mixture, n1 can be calculated from an amino equivalent.

Examples of diaminopolysiloxane include α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3-methylphenyl)polydimethylsiloxane, α,ω-bis(3-aminopropyl)polydiphenylsiloxane, and α,ω-bis (4-aminobutyl)polydimethylsiloxane.

The aromatic diamine compound having a polar group which constitutes a diamine component of the polyimidesiloxane has in its molecular structure a polar group which reacts with an isocyanate group or an epoxy group. The aromatic diamine compound preferably has the following formula (2):

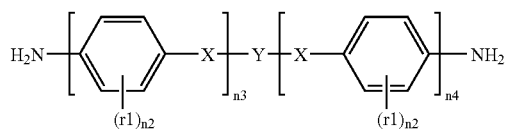

Formula (2)

In the formula (2), each of X and Y independently represents a bond, $CH_2$, $C(CH_3)_2$, $C(CF_3)_2$, O, a benzene ring, or $SO_2$; r1 represents COOH or OH; n2 is 1 or 2; each of n3 and n4 independently is 0, 1 or 2, preferably 0 or 1, with the proviso that at least one of n3 and n4 is 1 or 2.

Examples of the diamine compounds of the formula (2) are diamine compounds having OH group including diamine phenol compounds such as 2,4-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkane compounds such as 3,3'-diamino-4,4'1-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]propane, and 4,4'-diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether, and 4,4'-diamino-2,2',5,5'-tetrahydroxydiphenyl ether; hydroxydiphenyl sulfone compounds such as 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, and 4,4'-diamino-2,2',5,5'-tetrahydroxydiphenyl sulfone; bis(hydroxyphenoxyphenyl) alkane compounds such as 2,2-bis[4-(4-amino-3-hydroxyphenoxy)phenyl] propane; bis(hydroxyphenoxy)biphenyl compounds such as 4,4'-bis(4-amino-3-hydroxyphenoxy)biphenyl; and bis(hydroxyphenoxyphenyl) sulfone compounds such as 2,2-bis[4-(4-amino-3-hydroxyphenoxy)phenyl] sulfone.

Further examples of the diamine compounds of the formula (2) are diamine compounds having COOH group including benzenecarboxylic acid compounds such as 3,5-diaminobenzoic acid and 2,4-diaminobenzoic acid; 3,3-diamino-4,4'-dicarboxybiphenyl, 4,4'-diamino-3,3'-dicarboxybiphenyl, and 4,4-diamino-2,2',5,5'-tetracarboxybiphenyl; carboxydiphenylalkane compounds such as 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis[3-amino-4-carboxyphenyl]hexafluoropropane, and 4,4'-diamino-2,2',5,5'-tetracarboxybiphenyl; carboxydiphenyl ether compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether, and 4,4'-diamino-2,2',5,5'-tetracarboxydiphenyl ether; carboxydiphenyl sulfone compounds such as 3,3'-diamino-4,4'-dicarboxydiphenyl sulfone, 4,4'-diamino-3,3'-dicarboxydiphenyl sulfone, and 4,4'-diamino-2,2',5,5'-tetracarboxydiphenyl sulfone; bis(carboxyphenoxyphenyl)alkane compounds such as 2,2-bis[4-(4-3-carboxyphenoxy)phenyl]propane; bis(carboxyphenoxy)biphenyl compounds such as 4,4'-bis(4-amino-3-carboxyphenoxy)biphenyl; and bis(carboxyphenoxyphenyl) sulfone compounds such as 2,2-bis[4-(4-amino-3-carboxyphenoxy)phenyl] sulfone.

There are no specific limitations with respect to the diamine compound other than the aforementioned diaminopolysiloxane and aromatic diamine having a polar group which can constitute the polyimidesiloxane. Preferred is an aromatic diamine compound having the following formula (3):

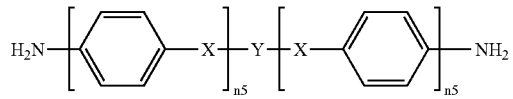

Formula (3)

In the formula (3), each of X and Y independently represents a bond, $CH_2$, $C(CH_3)_2$, $C(CF_3)_2$, O, a benzene ring, or $SO_2$; and n5 is 1 or 2.

Examples of the aromatic diamine compounds of the formula (3) include diamine compounds having one benzene ring, such as 1,4-diaminobenzene, 1,3-diaminobenzene, 2,4-diaminotoluene, and 1,4-diamino-2,5-dihalogenobenzene; diamine compounds having two benzene rings, such as bis(4-aminophenyl) ether, bis(3-aminophenyl) ether, bis(4-aminophenyl) sulfone, bis(3-aminophenyl) sulfone, bis(4-aminophenyl)methane, bis(3-aminophenyl)methane, bis(4-aminophenyl) sulfide, bis(3-aminophenyl) sulfide, 2,2-bis(4-aminophenyl)propane, 2,2-bis(3-aminophenyl)propane, 2,2-bis(3-aminophenyl)propane, 2,2-bis(4-aminophenyl) hexafluoropropane, o-dianisidine, o-tolidine, and tolidinesulfonic acid; diamine compounds having three benzene rings, such as 1,4-bis(4-aminophenoxy)benzene, 1,4-bis(3-aminophenoxy)benzene, 1,4-bis(4-aminophenyl)-benzene, 1,4-bis(3-aminophenyl)benzene, α,α'-bis(4-aminophenyl)1,4-diisopropylbenzene, and α,α'-bis(4-aminophenyl)-1,3-diisopropylbenzene; diamine compounds having four or more benzene rings, such as 2,2-bis[4-(4-aminophenoxy)phenyl]propane, 2,2-bis[4-(4-aminophenoxy)phenyl]-hexafluoropropane, 2,2-bis[4-(4-aminophenoxy)phenyl] sulfone, 4,4'-(4-aminophenoxy)biphenyl, 9,9-bis(4-aminophenyl)fluorene, and 5,10-bis(4-aminophenyl) anthracene.

In addition, an aliphatic diamine compound such as hexamethylenediamine or diaminododecane can be employed in combination with the above-mentioned diamine compounds.

The polyimidesiloxane can be prepared by the following processes.

a) Equimolar amounts of the tetracarboxylic acid compound and diamine compound are reacted with each other in a polar organic solvent at 15-250° C. to conduct polymerization and imidization, to give the polyimidesiloxane.

b) Each of the tetracarboxylic acid compound and diamine compounds is divided. The diamine compound (e.g., diaminopolysiloxane) and an excessive amount of the tetracarboxylic acid compound are reacted with each other in a polar organic solvent at 15-250° C. to conduct polymerization and imidization, to give an imidesiloxane oligomer (mean polymerization degree: approx. 1 to 10) having a terminal acid anhydride group (or acid group or ester group). Independently, the tetracarboxylic acid compound and an excessive amount of the diamine compound are reacted with each other in a polar organic solvent at 15-250° C. to conduct polymerization and imidization, to give an imide oligomer (mean polymerization degree: approx. 1 to 10) having a terminal amino group. Both are mixed under the condition that the acid component and the diamine component are present in equimolar amounts, reacted with each other at 15-60° C., and further reached at 130-250° C., to give the polyimidesiloxane.

c) Equimolar amounts of the tetracarboxylic acid compound and diamine compounds are reacted in a polar organic solvent at 20-80° C., to perform polymerization to give a polyamic acid. The polyamic acid is imidized to give the polyimidesiloxane.

Examples of the polar organic solvents employed in the above-mentioned reaction for obtaining the polyimidesiloxane include nitrogen atom-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, and N-methylcaprolactam; sulfur atom-containing solvents such as dimethylsulfoxide, diethyl sulfoxide, dimethyl sulfone, diethyl sulfone, and hexamethylsulfoamide; phenolic solvents such as cresol, phenol, and xylenol; diglyme solvents such as diethylene glycol dimethyl ether (diglyme), triethylene glycol dimethyl ether (triglyme), and tetraglyme; and oxygen atom-containing solvents such as acetone, methanol, ethanol, ethylene glycol, dioxane, and tetrahydrofuran. Pyridine and tetramethylurea are also employable. Optionally, aromatic hydrocarbon solvents such as benzene, toluene and xylene or other organic solvents such as solvent naphtha or benzonitrile can be employed in combination with the polar organic solvent.

The polyimidesiloxane prepared by any of the above-mentioned processes a)-c) can be employed.

It is preferred that the polyimidesiloxane is soluble in the organic solvent at a concentration of 3 wt. % or more, more preferably 5 to 60 wt. %, and that the polyimidesiloxane solution shows a solution viscosity (at 25° C., determined by means of E-type rotary viscometer) in the range of 1 to 10,000 poise, more preferably 1 to 100 poise.

The polyimidesiloxane preferably has a higher molecular weight and a higher imidization ratio, from the view points of mechanical characteristics (such as strength and elongation) of the cured product. The higher molecular weight roughly corresponds to a logarithmic viscosity (0.5 g/100 mL, solvent: N-methyl-2-pyrrolidone, at 30° C.) of 0.15 or more, especially 0.16 to 2. The imidization ratio which can be determined from IR spectrum preferably is 90% or more, more preferably 95% or more, further preferably essentially 100%.

The curing component employed in the polyimidesiloxane solution composition of the invention is an epoxy compound and/or a polyvalent isocyanate compound.

The epoxy compound preferably is a liquid or solid epoxy resin having an epoxy equivalent in the range of 100 to 4,000 and a molecular weight of 300 to 10,000.

There are no specific limitations with respect to the polyvalent isocyanate compound, so far as the isocyanate compound contains at least two isocyanate group in its molecular structure. Examples of the polyvalent isocyanate compounds include aliphatic, alicyclic, and aromatic diisocyanates, such as 1,4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanatemethyl-3,5,5-trimethylcyclohexyl isocyanate (isophorone diisocyanate), 1,3-bis(isocyanatemethyl)-cyclohexane, 4,4'-dicyclohexylmethane diisocyanate, tolylene diisocyanate, 4,4'-diphenylmethane diisocyanate, 1,5-naphthalene diisocyanate, toluidine diisocyanate, and xylylene diisocyanate.

Other examples of the polyvalent isocyanate compounds are those derived from aliphatic, alicyclic and aromatic polyvalent isocyanates, such as isocyanurate-modified polyvalent isocyanate, biuret-modified polyvalent isocyanate, and urethane-modified polyvalent isocyanate.

A preferred polyvalent isocyanate is a blocked polyvalent isocyanate which is produced by blocking the isocyanate groups of the polyvalent isocyanate with a blocking agent. Examples of the blocking agents are alcohol compounds, phenol compounds, active methylene compounds, mercaptan compounds, acidamide compounds, acidimide compounds, imidazole compounds, urea compounds, oxime compounds, amine compounds, imide compounds, and pyridine compounds. The blocking agents can be used singly or in combination. Concrete examples of the blocking agents include alcohol compounds such as methanol, ethanol, propanol, butanol, 2-ethylhexanol, methycellosolve, butylcellosolve, methylcarbitol, benzyl alcohol, and cyclohexanol; phenol compounds such as phenol, cresol, ethylphenol, butylphenol, nonylphenol, dinonylphenol, styrene modified phenol, and hydroxybenzoate, active methylene compounds such as dimethyl malonate, diethyl malonate, methyl acetoacetate, ethyl acetoacetate, and acetylacetone; mercaptan compounds such as butylmercaptan and dodecylmercaptan; acidamide compounds such as acetanilide, amide acetate, ε-caprolactam, δ-valerolactam, γ-butyrolactam; acidimide compounds such as imide succinate and imide maleate; imidazole compounds such as imidazole and 2-methylimidazole; urea compounds such as urea, thiourea, ethyleneurea; oxime compounds such as formaldoxime, acetaldoxime, acetoxime, methyl ethyl ketoxime, and cyclohexanonoxime; amine compounds such as diphenylamine, aniline, and carbazole; imine compounds such as ethylene imine and polyethylene imide; hydrogensulfite compounds such as sodium hydrogensulfite; and pyridine compounds such as 2-hydroxypyridine and 2-hydroxyquinoline.

In the invention, the curing component is employable in an amount of 1 to 50 weight parts, preferably 1 to 40 weight parts, more preferably 2 to 40 weight parts, per 100 weight parts of the polyimidesiloxane. In the polyimidesiloxane solution composition of the invention, an epoxy compound alone or a combination of an epoxy compound and a blocked polyvalent isocyanate compound is favorably employed. In the combination of the epoxy compound and the blocked polyvalent isocyanate compound, a combination of 0.5 to 30 weight parts of an epoxy compound and 2 to 40 weight parts of a blocked polyvalent isocyanate compound are preferably used per 100 weight parts of the polyimidesiloxane. This combination can be cured at a low temperature such as 130° C. or lower and shows good adhesion with sealing materials.

The silicone defoamer employed in the polyimidesiloxane solution composition of the invention comprises dimethylpolysiloxane, a polysiloxane compound having a hydrophilic group in a side chain thereof or at a terminal thereof, and a micro-powdery silica, and belongs to the generally called "self-emulsifiable defoamer". The silicone defoamer preferably shows a water drop contact angle of not higher than 50°, more preferably not higher than 25°.

A representative example of the hydrophilic group attached to the side chain or at the terminal of the polysiloxane compound is a polyoxyalkylene group. Examples of the polyoxyalkylene groups include polyoxyethylene group, polyoxypropylene group, polyoxybutylene group, and polyoxyethylenoxypropylene group (i.e., a copolymer group derived from ethylene oxide and propylene oxide). The polyoxyethylenoxypropylene group is most preferred.

The hydrophilic group such as a polyoxyalkylene group can be attached to the side chain or at the terminal of the polysiloxane main chain of the polysiloxane compound. The hydrophilic group can be attached to the polysiloxane main chain via a connecting group such as an alkylene group.

The polysiloxane components (i.e., dimethylpolysiloxane and the polysiloxane compound having a hydrophilic group in the side chain or at the terminal) preferably contains the polysiloxane compound having a hydrophilic group in the side chain or at the terminal, in an amount of approx. 50 weight % or more, more preferably approx. 60 to 90 weight %.

The silicone defoamer employed in the invention may contain small amounts of various other polysiloxane compounds such as polysiloxane compounds modified with an aromatic group (e.g., phenyl).

The silicone defoamer employed in the invention preferably contains 1 to 20 weight parts of the micro-powdery silica per 100 weight parts of a combination of dimethylpolysiloxane and the polysiloxane having the hydrophilic group.

The silicone defoamer employed in the invention is commercially available from Shin-Etsu Chemical Industries Co., Ltd., under tradenames of KS530, KS531 and KS538.

In addition, the polyimidesiloxane solution composition of the invention preferably contains a fine inorganic filler. The fine inorganic filler preferably has a mean diameter of 0.001 to 15 μm, more preferably 0.005 to 10 μm. Examples of the fine fillers include aerogil (i.e., micro-powdery silica), talc, mica, and barium sulfate. Preferred is a combination of aerogil and talc, mica and/or barium sulfate. More preferred is a combination of aerogil, talc and barium sulfate.

The fine inorganic filler is effective to control viscosity characteristics when the polyimidesiloxane solution composition is used to form a coated film by screen printing, and further effective to appropriately decrease tin invasion (a phenomenon in which tin enters between a copper foil and an insulating film to produce pitting corrosion in the copper foil).

The fine inorganic filler can be preferably employed in an amount of 20 to 150 weight parts, more preferably 40 to 125 weight parts, per 100 weight parts of polyimidesiloxane.

In addition, the polyimidesiloxane solution composition of the invention preferably contains a dissociating catalyst which causes dissociation of a blocking agent from a blocked polyvalent isocyanate at a temperature higher than a predetermined temperature, and a curing catalyst (or a curing accelerator catalyst) which accelerates a curing reaction between the polar group of polyimidesiloxane and the epoxy group and/or the isocyanate group.

Examples of the dissociating catalysts for blocked polyvalent isocyanate include dibutyl tin laurate and tertiary amines. The dissociating catalyst is preferably employed in an amount of approx. 0.01 to 25 weight parts, more preferably approx. 0.1 to 15 weight parts, per 100 weight parts of the blocked polyvalent isocyanate.

Examples of the curing accelerator catalysts include imidazoles such as 2-ethyl-4-methylimidazole and tertiary amines. The curing accelerator catalyst is preferably employed in an amount of approx. 0.01 to 25 weight parts, more preferably approx. 0.1 to 15 weight parts, per 100 weight parts of the blocked polyvalent isocanate.

In the case that the polyimidesiloxane solution composition of the invention comprises both of an epoxy compound and a blocked polyvalent isocyanate, the solution composition preferably contains a tertiary amine which can serve as a dissociating catalyst and further as a curing accelerator catalyst.

Examples of the tertiary amines include 1,8-diazabicyclo[5.4.0]-7-undecene (can be abbreviated to OBU), N,N-dimethylbenzylamine, N,N,N',N'-tetramethylhexanediamine, triethylenediamine (TEDA), 2-dimethylaminomethylphenol (DMP-10), 2,4,6-tris(dimethylamino)-phenol (DMP-30), dimorpholinodiethyl ether (DMDEE), 1,4-dimethylpiperazine, and cyclohexyldimethylamine.

Among the above-mentioned tertiary amines, 1,8-diazabicyclo[5.4.0]-7-undecene (DBU), N,N-dimethylbenzylamine, and N,N,N', N'-tetramethylhexanediamine are particularly preferred, because these amines can cause dissociation of a blocking agent from the blocked isocyanate at an appropriate temperature and further causes acceleration of cross-linking reaction between the polyimidesiloxane and the epoxy compound and polyvalent isocyanate at an appropriate temperature, when the polyimidesiloxane solution composition of the invention comprises both of the epoxy compound and blocked polyvalent isocyanate.

The tertiary amine can be employed in an amount of 0.5 to 20 weight parts, preferably 1 to 10 weight parts, per 100 weight parts of a compound having a polysiloxane skeleton.

The organic solvent of the polyimidesiloxane solution composition of the invention can be an organic solvent which has been used for the preparation of the polyimidesiloxane. Preferred examples are nitrogen atom-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, and N-methylcaprolactam; sulfur atom-containing solvents such as dimethylsulfoxide, diethyl sulfoxide, dimethyl sulfone, diethyl sulfone, and hexamethylsulfoamide; phenolic solvents such as cresol, phenol, and xylenol; diglyme solvents such as diethylene glycol dimethyl ether (diglyme), triethylene glycol dimethyl ether (triglyme), and tetraglyme; and oxygen atom-containing solvents such as acetone, acetophenone, propiophenone, ethylene glycol, dioxane, and tetrahydrofuran. More preferred examples are N-methyl-2-pyrrolidone, N,N-dimethylsulfoxide, N,N-dimethylformamide, N,N-diethylformamide, N,N-dimethylacetamide, N,N-diethylacetamide, butyrolactone, triethylene glycol dimethyl ether, and diethylene glycol dimethyl ether. Particularly preferred are diglyme solvents such as diethylene glycol dimethyl ether (diglyme), triethylene glycol dimethyl ether (triglyme), and tetraglyme.

The polyimidesiloxane solution composition of the invention may further contain 0.1 to 100 weight parts of a colored organic pigment or a colored inorganic pigment, per 100 weight parts of the polyimidesiloxane.

The polyimidesiloxane solution composition of the invention can be easily prepared by mixing the predetermined amounts of polyimidesiloxane, a curing component such as an epoxy compound and/or a polyvalent isocyanate, the silicone defoamer, a fine filler, and an organic solvent uniformly under stirring. The polymerization solution containing polyimidesiloxane can be employed as such or after by diluting with an appropriate organic solvent. The organic solvent can be the polar organic solvent employed in the preparation of polyimidesiloxane. The organic solvent preferably has a boiling point of 140° C. to 210° C. If the solution composition is to be processed by screen printing, the organic solvent preferably is an organic solvent (e.g., triglyme) having a boiling point of 180° C. to 200° C. Such organic solvent is favorably employable because the organic solvent hardly evaporates and diminishes. The organic solvent is generally used in an amount of 60 to 200 weight parts, per 100 weight parts of the polyimidesiloxane.

The polyimidesiloxane solution composition of the invention preferably has a solution viscosity (at room temperature, 25° C.) in the range of 50 to 10,000 poise, more preferably 100 to 1,000 poise, most preferably 100 to 600 poise. The solution composition having such solution viscosity is preferred in consideration of workability of the screen printing and characteristics of the resulting insulating cured film.

The polyimidesiloxane solution composition of the invention can be satisfactorily applied on a board such as a flexible wiring board by a screen printing method, and converted into an insulating cured film by heating at a relatively low temperature. The resulting insulating cured film shows good adhesion onto the board, little warpage, good heat resistance, good resistance to solvents and chemicals (little tin invasion), high flexing strength, and good electric characteristics. Particularly, the solution composition shows good deaeration (quickly releases air babbles, within 400 sec. or shorter, particularly 100 sec. or shorter, according to the later-mentioned measurement method). Therefore, the workability in the screen printing of the solution composition for the preparation of the insulating cured film is prominently improved. Moreover, the repulsion in the vicinity of the cured film which causes poor adhesion after the application of the solution composition onto a wiring board and heat treatment of the applied solution composition. The repulsive space preferably is 100 μm or shorter, more preferably 30 μm or shorter, according to the later-mentioned measurement method. Therefore, good wettability of an anisotropic conductive film or an anisotropic conductive paste onto the outer lead area is assured, and highly reliable electric connection can be accomplished.

The procedure for applying the polyimidesiloxane solution composition onto a wiring board is described below.

A representative application procedure comprises the steps of:

(1) coating the polyimidesiloxane solution composition on a local area of an electric circuit surface of a wiring board so as to form a coated film locally covering the wiring area;

(2) heating the coated solution composition film to give an insulating cured film; and (3) forming an electrical contact of an anisotropic conductive film (ACF) or an anisotropic conductive paste (ACP) on a wiring area on which no insulating cured film is formed.

The conventionally employed application procedures can be utilized except for using the polyimidesiloxane solution composition of the invention.

FIG. 1 illustrates a section of a wiring board on which a chip component (such as IC chip component) is attached to the inner lead, and an electrode of a liquid display device is attached to the outer lead via ACF or ACP.

The wiring board of FIG. 1 can be manufactured by the following process.

(1) A wiring board composed of an insulating polyimide film board 1 and an electric circuit wiring 2 formed on the film board. The surface of the electric circuit wiring 2 is optionally plated with tin.

(2) The polyimidesiloxane solution composition is applied onto a predetermined area of the surface of the wiring board by screen printing, and the applied film is heated to 50 to 210° C. to give an insulating cured film 3. The heating is generally carried out at approx. 160° C. but, if a tin-plating is already made on the circuit wiring, the heating is carried out at a relatively low temperature such as approx. 120° C.

(3) The area of surface of the circuit wiring on which no insulating cured film is placed is plated with tin to form a tin-plated layer 4 If the tin-plating is already made, this step can be omitted.

(4) A chip component 5 is electrically connected to a wiring area coated with no insulating cured film (inner lead) via gold bump 6.

(5) An underfill material 7 (curing resin such as an epoxy resin) is incorporated into a space between the insulating polyimide film board 1 and the chip component 5, and then heated to approx. 150-160° C., to cure the underfill material.

(6) An electrode 9 of a liquid display panel substrate 10 is connected to the wiring board at a wiring area coated with no insulating cured film (outer lead) via ACF or ACP8.

EXAMPLES

In the following examples, "deaeration period" is determined by the following procedures.

A polyimidesiloxane composition is manually coated on a polyimide film (UPILEX 25S) in a framed 1 cm×1 cm area using a squeegee (hardness: 70, made of silicone rubber) and a screen mask (SUS #180, emulsion thickness: 15 μm, mesh thickness: 101 μm ). The coated surface is observed through a light microscope (×10) under transmitted light, to measure a period of time until all bubbles diminish. The measurement is repeated three times, and an average of the measure periods is indicated as "deaeration period". A shorter deaeration period means good deaeration property.

The "repulsion" is evaluated by the following procedures.

A polyimidesiloxane solution composition is coated on a mirror face of a copper foil (CF-T8, available from Fukuda Metal Foil Powder Industries Co., Ltd.) using a screen mask (SUS#180, emulsion thickness: 15 μm, mesh thickness: 101 μm) and a squeegee (hardness: 70, made of silicone rubber). The coated composition is heated to 120° C. (or 160° C.) for one hour to perform curing. The copper foil is then plated with tin and heated to 150° C. for 2 hours. Thus, a test sample for evaluating repulsion is prepared.

In the evaluation of repulsion, 0.1 mL of a mixed liquid No. 35.0 for wetting tension test (available from Wako Pure Chemical Co., Ltd.) is spotted onto the test sample at a position apart from the side line of the cured film by 1 cm using a dropping pipet. Subsequently, the dropped liquid is moved onto the cured film over the side line by means of a tip of the dropping pipet, and the moved liquid is then returned onto the copper surface. Thereafter, a space formed between the side line of the cured film and a side line of the returned liquid which is produced by repulsion on the copper surface is measured. A larger space means that the repulsion is higher.

The ACF adhesion strength is measured by the following procedures.

A test sample for measurement of the ACF adhesion strength is prepared in the same manner as that employed for the evaluation of "repulsion". Separately, ACF (EP1708E, available from Sony Chemical Co., Ltd.) is pressed onto a mirror face of a copper foil (CF-T8, available from Fukuda Metal Foil Powder Industries Co., Ltd.) at 60° C. Then, the ACF area of the copper foil having ACP is placed in the vicinity of the cured film on the test sample for measurement of ACF adhesion strength, and the copper foil is pressed at a pressure of 10 kg/cm² at 190° C. for 10 seconds. Thus, a composite for peeling test is produced. The composite is then subjected to 90° peel test to determine the peeling strength.

The water drop contact angle is measured by the following procedures.

A defoamer is coated on a mirror face of a copper foil (CF-T8, available from Fukuda Metal Foil Powder Industries Co., Ltd.) to form a thin layer. On the thin layer is spotted a drop of pure water, and the contact angle is measured by means of a water drop angle-measuring apparatus. The measurement is repeated five times, and its average value is indicated as the water drop contact angle.

In the working examples and comparison examples, the following materials (other than a defoamer) are employed:

[Epoxy Compound]
(1) Epikote 828: epoxy resin, epoxy equivalent: 190, available from Japan Epoxy Resin Co., Ltd.;
(2) Epikote 157S70: epoxy resin, epoxy equivalent: 210, available from Japan Epoxy Resin Co., Ltd.;

[Polyvalent Isocyanate Compound]
B-882N: Takenate B-882N, blocked 1,6-hexamethylene diisocyanate (blocking agent: methyl ethyl ketoxime), available from Mitsui-Takeda Chemical Co., Ltd.);

[Curing Catalyst]
2E4MZ: 2-ethyl-4-methylimidazole, available from Shikoku Chemical Industries Co., Ltd.);
DBU: 1,8-diazabicyclo[5.4.0]-7-undecene, available from Aldrich Corp.;

[Inorganic Filler]
Aerogil #50: mean size: 30 nm, available from Japan Aerogil Co., Ltd.;
Aerogil #130: mean size: 16 nm, available from Japan Aerogil Co., Ltd.;
Talc P-3: Microace P-3, mean size: 5.1 μm available from Japan Talc Co., Ltd.;

Barium sulfate B-30: mean size: 0.3 μm, available from Sakai Chemical Industries Co., Ltd.

Reference Example 1

Preparation of Polyimidesiloxane Solution

In a 500 mL-volume glass flask were placed 47.1 g (0.16 mol.) of 2,3,3',4'-biphenyltetracarboxylic acid dianhydride and 100 g of methyltriglyme (TG, solvent). The content in the flask was heated to 180° C. under stirring in a nitrogen atmosphere. In the flask were further placed 125.1 g (0.136 mol.) of α,ω-bis(3-aminopropyl)-polydimethylsiloxane (amino equivalent: 460) and 40 g of TG. The content in the flask was then heated to 180° C. for 60 min., under stirring. To the reaction mixture were is added 6.9 g (0.024 mol.) of 3,3'-carboxy-4,4'-diaminodiphenylmethane (MBAA) and 39 g of TG, and the resulting mixture was heated to 180° C. for 10 hours under stirring. The reaction mixture was then filtered. The resulting polyimidesiloxane reaction solution had a polymer solid concentration of 51 wt. %, and $\eta_{inh}$ of 0.20. The imidization ratio was almost 100%.

Example 1

In a glass vessel were placed 40.0 g of the polyimidesiloxane solution obtained in Reference Example 1, 3.7 g (9.25 weight parts per 100 weight parts of the polyimidesiloxane solution, same hereinafter) of Epikote 828 (epoxy compound), 0.08 g (0.2 weight part) of curing catalyst 2E4MZ, 0.9 g (2.25 weight parts) of silicone defoamer KS 531 (self-emulsifiable silicone defoamer available from Shin-Etsu Chemical Industries Co., Ltd., comprising dimethylpolysiloxane, a hydrophilic polysiloxane compound having polyethylenoxy-propylenoxy group in its side chain (in an amount larger than the amount of the dimethylpolysiloxane), and a micro-powdery silica; water drop contact angle: 18°), 3.9 g (9.75 weight parts) of Aerogil #50 (inorganic filler), 4.8 g (12.0 weight parts) of Microace P-3 (talc), and 14.5 g (36.25 weight parts) of Barium sulfate B-30. The content was stirred at 25° C. for 2 hours, to give a uniform polyimidesiloxane composition of the invention.

The deaeration period (sec.) and repulsion space (μm) of the polyimidesiloxane composition are set forth in Table 1.

Example 2

The procedures of Example 1 were repeated except that Epikote 828 (epoxy compound) was replaced with Epikote 157S70 and that the curing catalyst 2E4MZ was used in an amount of 0.25 weight part (amount relative to 100 weight parts of the polyimidesiloxane solution, same hereinafter), to give a polyimidesiloxane composition of the invention.

The deaeration period (sec.), repulsion space (μm), and ACF peeling strength (g/cm) of the polyimidesiloxane composition are set forth in Table 1.

Example 3

The procedures of Example 2 were repeated except that Epikote 157S70 (epoxy compound) was used in an amount of 1 weight part (amount relative to 100 weight parts of the polyimidesiloxane solution, same hereinafter), that 10 weight parts of the polyvalent isocyanate compound B-882N was supplemented, that the curing catalyst was changed to a combination of 0.1 weight part of 2E4MZ and 0.4 weight part of DBU, and the inorganic filler was changed to a combination of 2 weight parts of Aerogil #50, 8.25 weight parts of Aerogil #130, 22.75 weight parts of Microace P-3, and 11.25 weight parts of Barium sulfate B-30, to give a polyimidesiloxane composition of the invention.

The deaeration period (sec.) and repulsion space ($\mu$m) of the polyimidesiloxane composition are set forth in Table 1.

Example 4

The procedures of Example 2 were repeated except that the silicone defoamer KS531 was replaced with KS530 (self-emulsifiable silicone defoamer, comprising dimethylpolysiloxane, a hydrophilic polysiloxane compound having polyethylenoxy-propylenoxy group in its side chain (in an amount larger than the amount of the dimethylpolysiloxane), and a micro-powdery silica; water drop contact angle:. 13°), to give a polyimidesiloxane composition of the invention.

The deaeration period (sec.), repulsion space ($\mu$m), and ACF peeling strength (g/cm) of the polyimidesiloxane composition are set forth in Table 1.

Example 5

The procedures of Example 2 were repeated except that the silicone defoamer KS531 was replaced with KS538 (self-emulsifiable silicone defoamer, available from Shin-Etsu Chemical Industries Co., Ltd., comprising dimethylpolysiloxane, a hydrophilic polysiloxane compound having polyethylenoxy-propylenoxy group in its side chain (in an amount larger than the amount of the dimethylpolysiloxane), and a micro-powdery silica; water drop contact angle: 17°), to give a polyimidesiloxane composition of the invention.

The deaeration period (sec.), repulsion space ($\mu$m), and ACF peeling strength (g/cm) of the polyimidesiloxane composition are set forth in Table 1.

Comparison Example 1

The procedures of Example 2 were repeated except that the silicone defoamer KS531 was replaced with DB-100 (defoamer available from Dow Corning Asia Co., Ltd., comprising dimethylpolysiloxane and a micro-powdery silica; water drop contact angle: 66°), to give a polyimidesiloxane composition for comparison.

The deaeration period (sec.), repulsion space ($\mu$m), and ACF peeling strength (g/cm) of the polyimidesiloxane composition are set forth in Table 1.

Comparison Example 2

The procedures of Example 2 were repeated except that the silicone defoamer KS531 was replaced-with KS510 (oil-compound type silicone defoamer, available from Shin-Etsu Chemical Industries Co., Ltd., comprising a polyoxysiloxane compound having an alkyl group of at least 10 carbon atom in its side chain and a micro-powdery silica; water drop contact angle: 94°), to give a polyimidesiloxane composition for comparison.

The deaeration period (sec.), repulsion space ($\mu$m), and ACF peeling strength (g/cm) of the polyimidesiloxane composition are set forth in Table 1.

Comparison Example 3

The procedures of Example 2 were repeated except that the silicone defoamer KS531 was replaced with X-50-1041 (emulsion type silicone defoamer, available from Shin-Etsu Chemical Industries Co., Ltd., comprising dimethylpolysiloxane, a micro-powdery silica, and a emulsifying agent; water drop contact angle: 19°), to give a polyimidesiloxane composition for comparison.

The deaeration period (sec.), repulsion space ($\mu$m), and ACF peeling strength (g/cm) of the polyimidesiloxane composition are set forth in Table 1.

Comparison Example 4

The procedures of Example 2 were repeated except that the silicone defoamer KS531 was replaced with KM-981 (emulsion type silicone defoamer, available from Shin-Etsu Chemical Industries Co., Ltd., comprising dimethylpolysiloxane, a micro-powdery silica, and a emulsifying agent; water drop contact angle: 30°), to give a polyimidesiloxane composition for comparison.

The deaeration period (sec.), repulsion space ($\mu$m), and ACF peeling strength (g/cm) of the polyimidesiloxane composition are set forth in Table 1.

Comparison Example 5

The procedures of Example 2 were repeated except that the silicone defoamer KS531 was replaced with NOPCO NXZ (metal soap type defoamer, available from Sun-Nopco Co., Ltd., comprising a fatty acid metal salt; water drop contact angle: 10°), to give a polyimidesiloxane composition for comparison.

The deaeration period (sec.), repulsion space ($\mu$m), and ACF peeling strength (g/cm) of the polyimidesiloxane composition are set forth in Table 1.

Comparison Example 6

The procedures of Example 2 were repeated except that the silicone defoamer KS531 was replaced with Frolen AC-326F (acrylvinyl ether type defoamer, available from Kyoeisha Chemical Co., Ltd.; water drop contact angle: 42°), to give a polyimidesiloxane composition for comparison.

The deaeration period (sec.), repulsion space ($\mu$m), and ACF peeling strength (g/cm) of the polyimidesiloxane composition are set forth in Table 1.

TABLE 1

| | Deaeration period | Repulsion space | ACF peeling strength |
|---|---|---|---|
| Example 1 | 38 sec. | 0 $\mu$m | — |
| Example 2 | 47 sec. | 0 $\mu$m | 780 g/cm |
| Example 3 | 57 sec. | 0 $\mu$m | — |
| Example 4 | 37 sec. | 0 $\mu$m | 740 g/cm |
| Example 5 | 24 sec. | 0 $\mu$m | 750 g/cm |
| Com. Ex. 1 | 25 sec. | 500 $\mu$m | 740 g/cm |
| Com. Ex. 2 | 142 sec. | 400 $\mu$m | 280 g/cm |
| Com. Ex. 3 | 26 sec. | 410 $\mu$m | 290 g/cm |
| Com. Ex. 4 | 28 sec. | 370 $\mu$m | 340 g/cm |
| Com. Ex. 5 | >600 sec. | 0 $\mu$m | 770 g/cm |
| Com. Ex. 6 | >600 sec. | 0 $\mu$m | 780 g/cm |

The invention claimed is:

1. A polyimidesiloxane solution composition comprising an organic solvent, a polyimidesiloxane soluble in the organic solvent, at least one curing component selected from the group consisting of an epoxy compound and a polyvalent isocyanate compound, and a silicone defoamer, wherein the silicone defoamer comprises dimethylpolysiloxane, a polysiloxane compound having a hydrophilic group in a side chain thereof or at a terminal thereof, and a micro-powdery silica.

2. The polyimidesiloxane solution composition of claim 1, which comprises 1 to 50 weight parts of the curing component and 1 to 10 weight parts of the silicone defoamer per 100 weight parts of the polyimidesiloxane soluble in the organic solvent.

3. The polyimidesiloxane solution composition of claim 1, in which the defoamer contains the polysiloxane compound having a hydrophilic group in a side chain thereof or at a terminal thereof in an amount larger than an amount of the dimethylpolysiloxane.

4. The polyimidesiloxane solution composition of claim 1, in which the defoamer comprises 1 to 20 weight parts of the micro-powdery silica per total 100 weight parts of the dimethylpolysiloxane and the polysiloxane compound having a hydrophilic group in a side chain thereof or at a terminal thereof.

5. The polyimidesiloxane solution composition of claim 1, in which the hydrophilic group in the side chain or at the terminal of the polysiloxane compound is a polyoxyalkylene group.

6. The polyimidesiloxane solution composition of claim 5, in which the polyoxyalkylene group is a group comprising a copolymer of ethylene oxide and propylene oxide.

7. The polyimidesiloxane solution composition of claim 1, which further comprises an inorganic filler.

8. The polyimidesiloxane solution composition of claim 1, which further comprises a curing catalyst.

9. The polyimidesiloxane solution composition of claim 1, in which the silicone defoamer shows a water drop contact angle of not higher than 50°.

10. A method of preparing a wiring board having an insulating cured film on a surface thereof, which comprises a step of coating the polyimidesiloxane solution composition of claim 1 on a local area of an electric circuit surface of a wiring board to form a coated film, and a step of heating the coated film to give an insulating cured film.

11. A method of connecting an electronic component to a wiring board, which comprises the steps of coating the polyimidesiloxane solution composition of claim 1 on a local area of an electric circuit surface of a wiring board to form a coated film, heating the coated film to give an insulating cured film, and connecting an electronic component via an anisotropic conductive material to a wiring surface of the wiring board in an area having no insulating cured film thereon.

* * * * *